(12) United States Patent
Yang et al.

(10) Patent No.: US 9,691,670 B2
(45) Date of Patent: Jun. 27, 2017

(54) MANUFACTURING METHOD OF ARRAY SUBSTRATE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xiaoyu Yang, Beijing (CN); Xiaosong Zhang, Beijing (CN); Jiujuan Yang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 229 days.

(21) Appl. No.: 14/127,264

(22) PCT Filed: Nov. 9, 2012

(86) PCT No.: PCT/CN2012/084412
§ 371 (c)(1),
(2) Date: Dec. 18, 2013

(87) PCT Pub. No.: WO2014/000365
PCT Pub. Date: Jan. 3, 2014

(65) Prior Publication Data
US 2015/0332979 A1    Nov. 19, 2015

(30) Foreign Application Priority Data

Jun. 29, 2012 (CN) .......................... 2012 1 0227079

(51) Int. Cl.
    H01L 21/66    (2006.01)
    H01L 27/12    (2006.01)
    G02F 1/1362   (2006.01)

(52) U.S. Cl.
    CPC ............ H01L 22/14 (2013.01); G02F 1/1362 (2013.01); H01L 27/1262 (2013.01); G02F 2001/136254 (2013.01)

(58) Field of Classification Search
    CPC .................................................. H01L 2924/00
    (Continued)

(56) References Cited

U.S. PATENT DOCUMENTS

| | | |
|---|---|---|
| 6,999,153 B2 | 2/2006 | Choi et al. |
| 2005/0024315 A1* | 2/2005 | Yamagata ............ G09G 3/2011 345/98 |

(Continued)

FOREIGN PATENT DOCUMENTS

| | | |
|---|---|---|
| CN | 1996032 A | 7/2007 |
| CN | 101556382 A | 10/2009 |

(Continued)

OTHER PUBLICATIONS

International Search Report Dated Mar. 27, 2013 Appln. No. PCT/CN2012/084412.

(Continued)

Primary Examiner — Caleb Henry
Assistant Examiner — Mounir Amer
(74) Attorney, Agent, or Firm — Ladas & Parry LLP; Loren K. Thompson

(57) ABSTRACT

An embodiment of the present invention provides a manufacturing method of an array substrate comprising forming a gate detecting pattern on the array substrate with gate lines and common electrode lines formed thereon, the gate detecting pattern being arranged on one side of a pixel region of (Continued)

the array substrate and used to connect all the common electrode lines for pixel units; and performing a short circuit or a open circuit detection, wherein if the difference between a signal received by a receiving terminal for a gate line and a signal transmitted from a transmitting terminal for the gate line is larger than a predetermined detection threshold value, it is determined that short circuit between the gate line and a common electrode line or open circuit in the gate line occurs.

9 Claims, 4 Drawing Sheets

(58) Field of Classification Search
USPC .......................................... 324/760.01, 760.02
See application file for complete search history.

(56) References Cited

U.S. PATENT DOCUMENTS

| 2007/0158812 | A1 | 7/2007 | Sagiyama | |
|---|---|---|---|---|
| 2009/0194883 | A1* | 8/2009 | Qin | G02F 1/136227 257/773 |
| 2009/0315817 | A1* | 12/2009 | Pan | G09G 3/3655 345/87 |
| 2011/0092000 | A1* | 4/2011 | Coffy | G01R 1/0408 438/15 |
| 2012/0262184 | A1* | 10/2012 | Shen | G09G 3/006 324/537 |

FOREIGN PATENT DOCUMENTS

| CN | 102253550 A | 11/2011 |
|---|---|---|
| CN | 102723311 A | 10/2012 |

OTHER PUBLICATIONS

First Chinese Office Action Dated Sep. 27, 2013 Appln. No. 201210227079.2.
Second Chinese Office Action Dated Apr. 11, 2014 Appln. No. 201210227079.2.
International Preliminary Report on Patentability Appln. No. PCT/CN2012/084412; Dated Dec. 31, 2014.

* cited by examiner

MANUFACTURING METHOD OF ARRAY SUBSTRATE

BACKGROUND

Embodiments of the present invention relate to a manufacturing method of an array substrate.

Gate Driver on Array (GOA) technology, as a substitute for the process technology in which fabricating a driving chip by an external connecting silicon wafer, is an emerging technology in a liquid crystal display field, in which a gate driving circuit is directly fabricated on an array substrate. The application of the GOA technology may decrease the number of producing processes and the product cost and may improve the integration level of a thin film transistor-liquid crystal display (TFT-LCD) panel.

SUMMARY

An embodiment of the present invention provides a manufacturing method of an array substrate comprising: forming a gate detecting pattern on the array substrate with gate lines and common electrode lines formed thereon, the gate detecting pattern being arranged on one side of a pixel region of the array substrate and used to connect all the common electrode lines for pixel units; and performing a short circuit or a open circuit detection, wherein if the difference between a signal received by a receiving terminal for a gate line and a signal transmitted from a transmitting terminal for the gate line is larger than a predetermined detection threshold value, it is determined that short circuit between the gate line and a common electrode line or open circuit in the gate line occurs.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
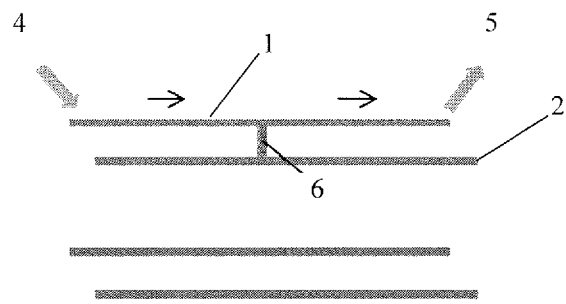
FIG. 1 is a schematic view for showing a gate pattern of a 20 inches GOA product in a related art.
Figure 2:
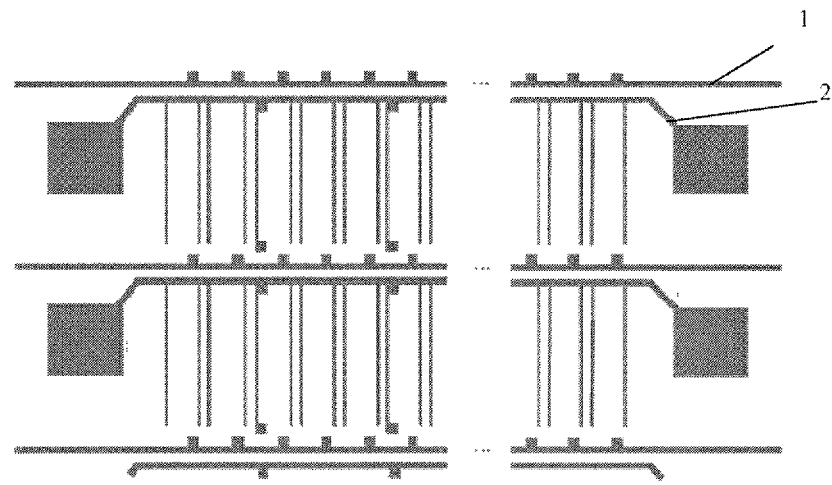
FIG. 2 is a circuit diagram of the gate pattern of the 20 inches GOA product in the related art.
Figure 3:
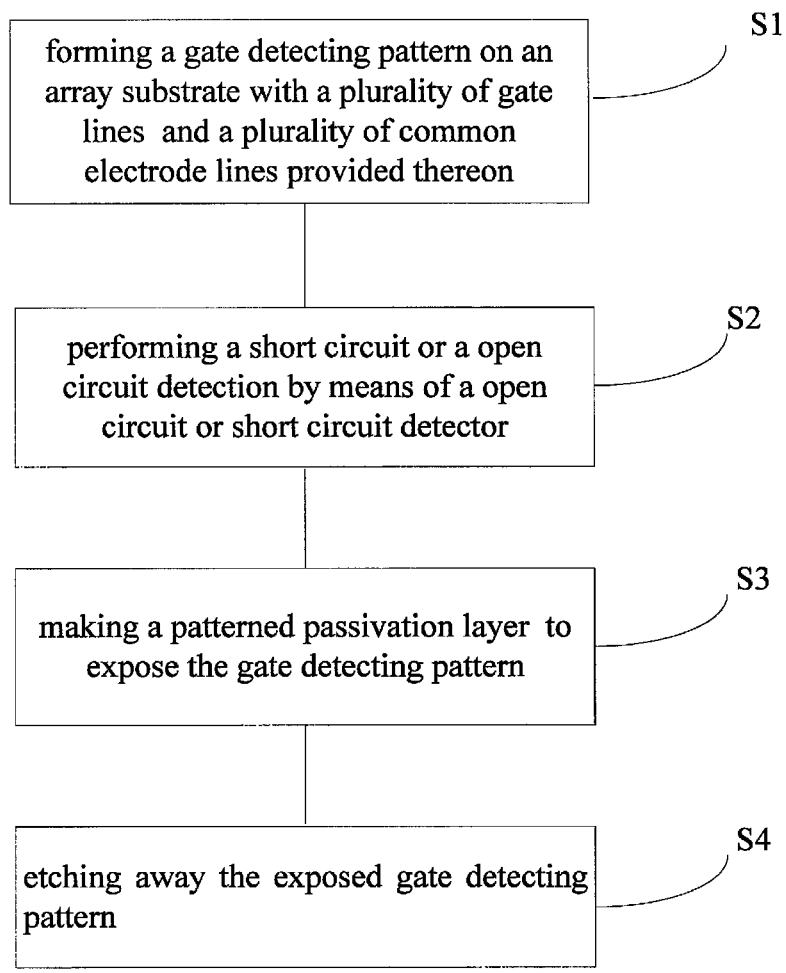
FIG. 3 is a flow chart of a manufacturing method according to an embodiment of the present invention.

In a related art, a design for a gate pattern of a GOA product with a size of 20 inches is that: the gate line and common electrode line both are suspended at both sides of a pixel region; according to a detecting principle of a current open circuit/short circuit detector, in a case that a short circuit defect occurs between the gate line and the common electrode line (GCS), a sensor of the open circuit/short circuit detector may not be may not receive a significant influenced signal, and the short circuit defect can not be detected out (as shown in FIG. 1 and FIG. 2), thus disturbing detection for the short circuit defect. However, an undetected GCS defect may cause abnormal lighting of the liquid crystal panel, and degrade the panel as a NG level panel, and the yield is disadvantageously influenced. Here, FIG. 1 and FIG. 2 show gate lines 1 and common electrode lines 2 in two adjacent pixel units, wherein the reference number 6 denotes a short circuit line, illustrating short circuit occurs between the gate line 1 and the common electrode line 2.

One of the objects of embodiments of the present invention is to improve the ability for detecting short circuit between a gate line and a common electrode line during manufacturing an array substrate.

As shown in FIGS. 3 to 8, there is provided a manufacturing method of an array substrate. The manufacturing method comprises the following steps.

Figure 4:
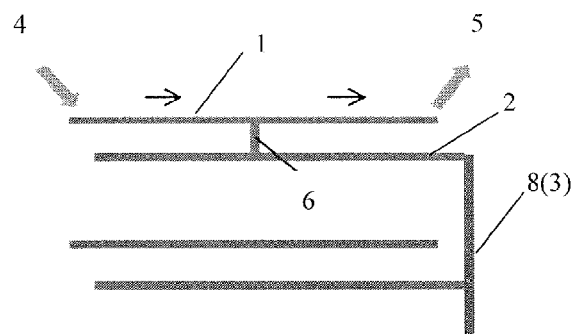
FIG. 4 is a schematic view for showing a gate pattern utilized in the manufacturing method according to an embodiment of the present invention.
Figure 5:
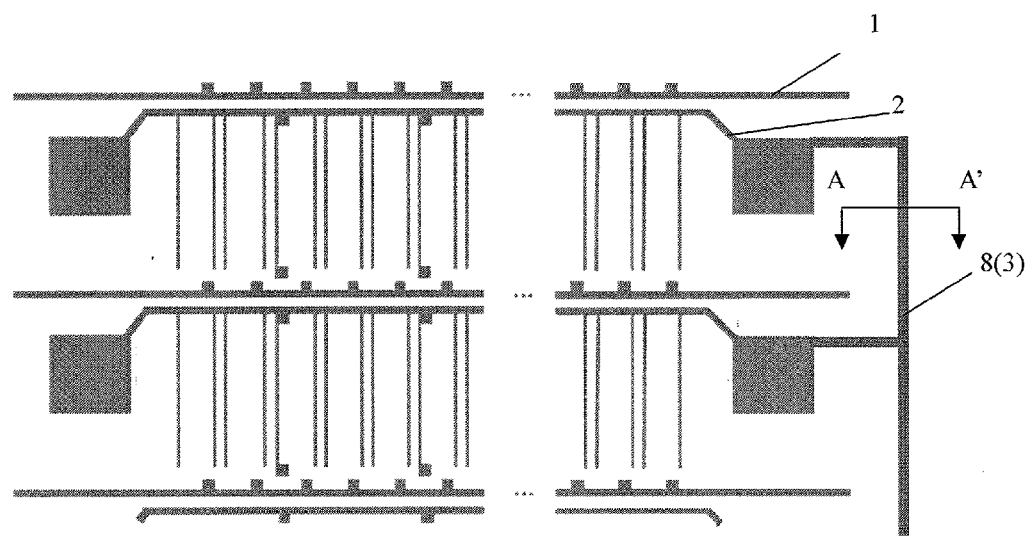
FIG. 5 is a circuit diagram of the gate pattern utilized in the manufacturing method according to an embodiment of the present invention.
Figure 6:
FIG. 6 is a cross-sectional view taken along a line A-A' of FIG. 5 after completion of a step S1 in the manufacturing method according to an embodiment of the present invention.

S1, forming a gate detecting pattern 8 on an array substrate with a plurality of gate lines 1 and a plurality of common electrode lines 2 provided thereon. In the present embodiment, the gate detecting pattern 8 is a detecting line 3 arranged on one side of a pixel region. The detecting line 3 is not electrically or physically connected to any one of the plurality of gate lines 1. However, the detecting line 3 electrically and physically connects all the common electrode lines 2 for pixel units, as shown in FIG. 4 and FIG. 5. FIG. 4 and FIG. 5 show the gate lines 1 and the common electrode lines 2 in two adjacent pixel units, wherein the reference number 6 denotes a short circuit line, illustrating that short circuit occurs between the gate line 1 and the common electrode line 2 located on an upper portion of FIG. 4. FIG. 6 shows a cross-sectional view taken along a line A-A' of FIG. 5 after completion of the step S1.

S2, performing a short circuit or open circuit detection by means of an open circuit/short circuit detector. If short circuit occurs between the gate line and the common electrode line, as shown by the gate line 1 and the common electrode line 2 on the upper portion of FIG. 4, a great portion of a gate signal to be received by a receiving terminal 5 for the gate line 1 may flow way via the common electrode line 2; if open circuit occurs in the gate line, a signal transmitted from a transmitting terminal 4 for the gate line 1 can not flow to the receiving terminal. Therefore, if the signal received by the receiving terminal 5 for the gate line 1 is detected to be far smaller than the signal transmitted from the transmitting terminal 4, that is, the difference of the signal received by the receiving terminal 5 for the gate line 1 and the signal transmitted from the transmitting terminal 4 is above a predetermined detection threshold value, then it is determined that a defect occurs at a certain position of the gate line (short circuit between the gate line and the common electrode line or open circuit of the gate line). Then, a position detection sensor of the open circuit/short circuit detector is utilized to find out a position information of the generated defect along the gate line 1 and upload it to a server, so that a following repairing process can perform a judging operation (to determine the type of the defect) and a repairing operation. The detection of the defect can avoid a consequent influence on the quality of the array substrate and even the liquid crystal panel, and because the ability for detecting a GCS defect by the detector is improved, the number of missed defects is reduced. Also, defective products can be corrected by repairing gate layer, thus avoiding being discarded due to CGS defect.

Figure 7:
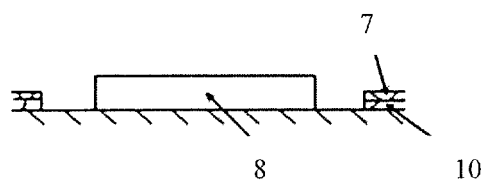
FIG. 7 is a cross-sectional view taken along the line A-A' of FIG. 5 after completion of steps S2 and S3 in the manufacturing method according to an embodiment of the present invention.

S3, making a patterned passivation layer 7 to expose the gate detecting pattern 8 (i.e., the detecting line 3). Herein, the material of the passivation layer 7 can be PVX. A making procedure of the patterned passivation layer 7 comprises, for example, depositing a passivation layer on the array substrate with the detecting line 3 formed thereon; and etching away the passivation layer around the detecting line 3 to uncover the detecting line 3, as shown in FIG. 7.

Figure 8:
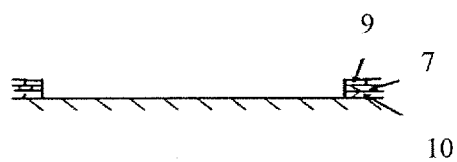
FIG. 8 is a cross-sectional view taken along the line A-A' of FIG. 5 after completion of a step S4 in the manufacturing method according to an embodiment of the present invention.

S4, etching way the exposed gate detecting pattern 8 (i.e., the detecting line 3), so that all the common electrode lines 2 for the pixel units are separated from each other. In addition, a common electrode layer 9 (whose material can be transparent conductive oxide material, such as, ITO) can be formed on the patterned passivation layer 7, as shown in FIG. 8.

In the above embodiment of the present invention, all the common electrode lines for the pixel units are connected together by the detecting line on one side of the pixel region so as to facilitate the detection of short circuit or the open circuit defect by the open circuit/short circuit detector during testing the array substrate. Therefore, during manufacturing the array substrate, the ability for detecting the short circuit between the gate line and the common electrode line or for the open circuit of the gate line is improved, and abnormal lighting of the liquid crystal panel due to the GCS defect can be avoided; Also, since the detecting line which is only used for detecting the short circuit or the open circuit is etched away in a following process, signal transmission of a resultant array substrate will not be influenced.

According to the above description, at least the following method according to an embodiments of the present invention can be provided:

(1) A manufacturing method of an array substrate comprising:

forming a gate detecting pattern on the array substrate with gate lines and common electrode lines formed thereon, the gate detecting pattern being arranged on one side of a pixel region of the array substrate and used to connect all the common electrode lines for pixel units; and performing a short circuit or a open circuit detection, wherein if the difference between a signal received by a receiving terminal for a gate line and a signal transmitted from a transmitting terminal for the gate line is larger than a predetermined detection threshold value, it is determined that short circuit between the gate line and a common electrode line or open circuit in the gate line occurs.

(2) The method according to (1), after performing the short circuit or the open circuit detection, further comprising:

making a passivation layer, wherein the material for the passivation layer around the gate detecting pattern is etched away to expose the gate detecting pattern; and etching away the exposed gate detecting pattern so that all the common electrode lines for the pixel units are separated from each other.

(3) The method according to (1) or (2), wherein the performing the short circuit or the open circuit detection is carried out by means of an open circuit/short circuit detector.

(4) The method according to (3), wherein during performing the short circuit or the open circuit detection, after it is determined that short circuit between gate line and common electrode line or open circuit in gate line occurs, a position detection sensor of the open circuit/short circuit detector is adopted to find out a position where the short circuit or the open circuit occurs along the gate line.

Although the present invention has been described in considerable detail with reference to specific embodiments thereof, some modifications or improvements may still be made on the basis of the present invention, which is evident to those skilled in the art. Therefore, those modifications or improvements, which are made without departing from the spirit of the present invention, all belong to the protection scope of the present invention.

What is claimed is:

1. A manufacturing method of an array substrate comprising: forming a gate detecting pattern on the array substrate with gate lines and common electrode lines formed thereon, the gate detecting pattern being arranged on one side of a pixel region of the array substrate and connected with all the common electrode lines for pixel units; wherein each of the gate lines has a left end portion and a right end portion, and performing a short circuit or an open circuit detection according to a difference between a first signal and a second signal, wherein the first signal is input into one of the gate lines via the left end portion of the one of the gate lines, and the second signal is directly output via the right end portion of the one of the gate lines, the first and second signals are the same in signal type, and after performing the short circuit or the open circuit detection, making a passivation layer, wherein the material for the passivation layer around the gate detecting pattern is etched away to expose the gate detecting pattern; and etching away the exposed gate detecting pattern so that all the common electrode lines for the pixel units are separated from each other.

2. The manufacturing method according to claim 1, wherein the performing the short circuit or the open circuit detection is carried out by means of an open circuit/short circuit detector.

3. The manufacturing method according to claim 1, wherein the performing the short circuit or the open circuit detection is carried out by means of an open circuit/short circuit detector.

4. The manufacturing method according to claim 2, wherein during performing the short circuit or the open circuit detection, after it is determined that short circuit between gate line and common electrode line or open circuit in gate line occurs, a position detection sensor of the open circuit/short circuit detector is adopted to find out a position where the short circuit or the open circuit occurs along the gate line.

5. The manufacturing method according to claim 3, wherein during performing the short circuit or the open circuit detection, after it is determined that short circuit between gate line and common electrode line or open circuit in gate line occurs, a position detection sensor of the open circuit/short circuit detector is adopted to find out a position where the short circuit or the open circuit occurs along the gate line.

6. The manufacturing method according to claim 1, wherein the material of the passivation is PVX.

7. The manufacturing method according to claim 1, wherein, the gate lines and the common electrode lines are disposed parallel with each other and in one-to-one correspondence.

8. The manufacturing method according to claim 1, wherein, the gate detecting pattern is directly connected with all the common electrode lines for pixel units.

9. The manufacturing method according to claim 1, wherein, the gate detecting pattern is disconnected with each of the gate lines.

* * * * *